United States Patent
Li et al.

(10) Patent No.: US 10,356,962 B2
(45) Date of Patent: Jul. 16, 2019

(54) POWER ELECTRONIC DEVICE COOLING SYSTEM AND DISTRIBUTED POWER GENERATION SYSTEM

(71) Applicant: Gree Electric Appliances, Inc. of ZHUHAI, Zhuhai, Guangdong (CN)

(72) Inventors: Hongbo Li, Zhuhai (CN); Hua Liu, Zhuhai (CN); Zhiping Zhang, Zhuhai (CN); Yu Zhou, Zhuhai (CN); Huaican Liu, Zhuhai (CN)

(73) Assignee: GREE ELECTRIC APPLIANCES, INC. OF ZHUHAI, Zhuhai, Guangdong (CN)

( * ) Notice: Subject to any disclaimer, the term of this patent is extended or adjusted under 35 U.S.C. 154(b) by 144 days.

(21) Appl. No.: 15/024,473

(22) PCT Filed: Jun. 25, 2014

(86) PCT No.: PCT/CN2014/080764
§ 371 (c)(1),
(2) Date: Mar. 24, 2016

(87) PCT Pub. No.: WO2015/043259
PCT Pub. Date: Apr. 2, 2015

(65) Prior Publication Data
US 2016/0219759 A1 Jul. 28, 2016

(30) Foreign Application Priority Data
Sep. 25, 2013 (CN) .......................... 2013 1 0442148

(51) Int. Cl.
*H05K 7/20* (2006.01)
*F25B 1/00* (2006.01)

(52) U.S. Cl.
CPC .......... *H05K 7/20936* (2013.01); *F25B 1/00* (2013.01)

(58) Field of Classification Search
CPC .......... H05K 7/20936; H05K 7/20663; H05K 7/20672; H05K 7/20681; H05K 7/2069;
(Continued)

(56) References Cited

U.S. PATENT DOCUMENTS 5,797,275 A 8/1998 Forsman
5,878,589 A * 3/1999 Tanaka ............... B60H 1/00007
165/80.2
(Continued)

FOREIGN PATENT DOCUMENTS

CN 1137824 A 12/1996
CN 1266978 A 9/2000
(Continued)

OTHER PUBLICATIONS

Mori, Hayato, Air Conditioning Device and Method, Jun. 2013, English Translation, European Patent Office.*
(Continued)

*Primary Examiner* — Frantz F Jules
*Assistant Examiner* — Steve S Tanenbaum
(74) *Attorney, Agent, or Firm* — Li & Cai Intellectual Property (USA) Office

(57) ABSTRACT

The invention discloses a power electronic device cooling system, which includes an air conditioning unit, a coolant pump (31), a bypass throttling element (32) and a cooler. The coolant pump (31) takes liquid from a first condenser (13) of the air conditioning unit, a liquid coolant enters the cooler after being throttled by the bypass throttling element (32), the low-temperature coolant cools a power electronic device at the cooler, and the coolant enters an evaporator (11) of the air conditioning unit to finish a cooling cycle after flowing out of the cooler. The power electronic device cooling system has a good cooling effect, and is high in cooling efficiency, small in equipment size and low in noise,
(Continued)

and moreover, the power electronic device may be located in a sealed environment and prevented from influence of dust, and is internally clean and long in operation life.

10 Claims, 2 Drawing Sheets

(58) Field of Classification Search
CPC .............. H05K 7/208; H05K 7/20809; H05K 7/20818; H05K 7/20827; F25B 1/00; F25B 5/02; F25B 23/006; F25B 41/00; F25B 1/003; F25B 2339/044
USPC ........................................................ 62/259.2
See application file for complete search history.

(56) References Cited

U.S. PATENT DOCUMENTS

| | | | |
|---|---|---|---|
| 6,116,040 A * | 9/2000 | Stark | F04B 39/06 62/113 |
| 2004/0257840 A1 | 12/2004 | Brasz et al. | |
| 2012/0211980 A1* | 8/2012 | Desabhatla | F02C 7/275 290/31 |
| 2012/0222438 A1* | 9/2012 | Osaka | B60H 1/00271 62/126 |
| 2013/0214763 A1* | 8/2013 | Kubota | H02J 3/14 324/113 |

FOREIGN PATENT DOCUMENTS

| | | | | | |
|---|---|---|---|---|---|
| CN | 1996707 | A | | 7/2007 | |
| CN | 101309578 | A | | 11/2008 | |
| CN | 101523131 | A | | 9/2009 | |
| CN | 101558268 | A | | 10/2009 | |
| CN | 103486752 | A | | 1/2014 | |
| CN | 203518304 | U | | 4/2014 | |
| JP | 1134640 | A | | 2/1999 | |
| JP | 11337193 | A | | 12/1999 | |
| JP | 2000283569 | A | | 10/2000 | |
| JP | 2010266132 | A | | 11/2010 | |
| JP | 2011117677 | A | | 6/2011 | |
| JP | WO 2012114182 | A1 | * | 8/2012 | ......... B60H 1/00278 |
| JP | 201375629 | A | | 4/2013 | |
| JP | 2013117360 | A | * | 6/2013 | |
| JP | 2013117360 | A | * | 6/2013 | |
| WO | WO-2012114182 | A1 | * | 8/2012 | ......... B60H 1/00278 |
| WO | WO 2013/095621 | A1 | | 6/2013 | |

OTHER PUBLICATIONS

Japan Patent Office, Office action dated Mar. 21, 2017 regarding the Japan counterpart patent application of the present application.
European Patent Office, European patent search report dated Jul. 24, 2017 regarding the European counterpart patent application of the present application.

* cited by examiner

POWER ELECTRONIC DEVICE COOLING SYSTEM AND DISTRIBUTED POWER GENERATION SYSTEM

TECHNICAL FIELD OF THE INVENTION

The invention relates to the technical fields of cooling and power electronics, and in particular to a power electronic device cooling system and a distributed power generation system.

BACKGROUND OF THE INVENTION

A power electronic device with high heat loss is required to be cooled, an air cooling manner is usually adopted for a power electronic device at present, and is implemented by mounting a facility such as a blower and a fan for cooling, but its cooling effect is poor, and there exists many problems; a cooling speed of air cooling is low, and the blower is large in size, which may cause a large size of the whole equipment; a large air volume may cause loud noise produced by the blower; reliability of components of the power electronic device is influenced by dust accumulation; the cooling blower is poor in adjustability, high in energy consumption and energy-consuming; and temperature of a mounting environment of the power electronic device is increased by exhaust of the blower, so that it is necessary to add a corresponding air conditioning system in a machine room.

SUMMARY OF THE INVENTION

In order to overcome shortcomings of a conventional art, the invention provides a power electronic device cooling system, to solve the problem of poor power electronic device cooling effect in the conventional art.

In order to achieve the purpose, the invention provides technical solutions as follows.

A power electronic device cooling system is provided, which includes an air conditioning unit, a coolant pump, a bypass throttling element and a cooler, wherein the air conditioning unit includes an evaporator, a compressor, a first condenser and a main branch throttling element which are connected into an air conditioning cooling circulation system, the first condenser, the coolant pump, the bypass throttling element, the cooler and the evaporator are sequentially communicated, an inlet of the coolant pump is communicated with the first condenser, an outlet of the coolant pump is communicated with a first end of the bypass throttling element, a second end of the bypass throttling element is communicated with a first end of the cooler, a second end of the cooler is communicated with the evaporator, and the cooler exchanges heat with a power electronic device to cool the power electronic device.

Furthermore, the power electronic device cooling system further includes a one-way valve, and an inlet of the one-way valve is communicated with the first condenser, and an outlet is communicated with the first end of the bypass throttling element.

Furthermore, the power electronic device cooling system further includes a second condenser, and the second condenser is connected between the cooler and the evaporator.

Furthermore, the power electronic device cooling system includes multiple cooling branches, each cooling branch includes a bypass throttling element and at least one cooler, an inlet of each cooling branch is communicated with the outlet of the coolant pump and the outlet of the one-way valve, and an outlet of each cooling branch is communicated with the second condenser.

Furthermore, the bypass throttling element is one or a combination of two or more of a capillary tube, a throttling orifice plate, a thermal expansion valve and an electronic expansion valve.

Furthermore, the air conditioning unit is a water-cooled air conditioning unit.

Furthermore, the power electronic device includes a rectifier module and an inverter module, the cooling branches include a first cooling branch and a second cooling branch, the first cooling branch is configured to cool the rectifier module, and the second cooling branch is configured to cool the inverter module.

Furthermore, the power electronic device further includes a reactor, and the cooling branches further include a third cooling branch configured to cool the reactor.

Furthermore, the first cooling branch includes a first branch throttling element, the second cooling branch includes a second bypass throttling element, the third cooling branch includes a third bypass throttling element, the first bypass throttling element and the second bypass throttling element are adjustable throttling elements, and the third bypass throttling element is a fixed-proportion throttling element.

The invention further provides a distributed power generation system, which includes a power electronic device cooling system and a distributed power plant, wherein the power electronic device cooling system is the abovementioned power electronic device cooling system, the distributed power generation system supplies power to a load and/or performs grid-connected power generation through a power electronic device, and the load includes an air conditioning unit.

Furthermore, the power electronic device includes an off-grid inverter, and the distributed power plant is connected with the off-grid inverter, and supplies power to the air conditioning unit through the off-grid inverter.

Furthermore, the power electronic device further includes a converter, and one end of the converter is connected with a public grid, while the other end is connected with the distributed power plant and/or the off-grid inverter.

The invention has beneficial effects as follows: compared with air cooling and water cooling, coolant cooling has the advantages of good cooling effect and high cooling efficiency; an air cooling system is eliminated, so that small equipment size and reduction in noise are ensured; a coolant of the air conditioning unit is utilized to finish cooling cycles, so that the power electronic device may be located in a sealed environment and prevented from influence of dust, and is internally clean and long in operation life; and influence of starting and stopping of the air conditioning unit is eliminated.

DETAILED DESCRIPTION OF THE EMBODIMENTS

In order to make the purpose, technical solutions and advantages of the invention clearer, the invention will be further described below with reference to the drawings and embodiments in detail. It should be understood that specific embodiments described here are only adopted to explain the invention and not intended to limit the invention.

Embodiment 1

Figure 1:
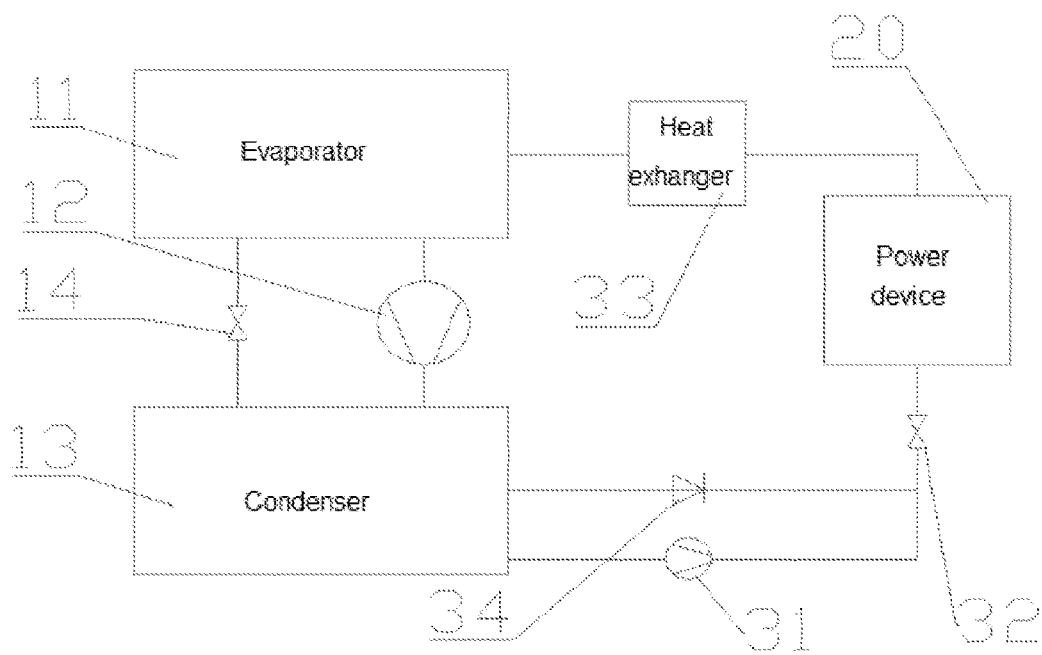
FIG. 1 is a structure diagram of a power electronic device cooling system according to embodiment 1 of the invention.

A power electronic device cooling system of the embodiment includes an air conditioning unit part and a power electronic device cooling circulation part, and FIG. 1 is a structure diagram of a power electronic device cooling system according to the embodiment. Wherein an air conditioning unit includes an evaporator 11, a compressor 12, a first condenser 13 and a main branch throttling element 14, an air suction port of the compressor 12 is communicated with one end of the evaporator 11 through an air suction pipeline, an exhaust port of the compressor 12 is communicated with one end of the first condenser 13 through an exhaust pipeline, and the other end of the evaporator 11 is communicated with the other end of the first condenser 13 through the main branch throttling element 14.

The power electronic device cooling circulation part includes a coolant pump 31, a bypass throttling element 32 and a cooler (not shown in the figure). An inlet of the coolant pump 31 is communicated with a liquid outlet pipe of the first condenser 13, an outlet of the coolant pump 31 is communicated with a first end of the bypass throttling element 32, a second end of the bypass throttling element 32 is communicated with a first end of the cooler, and a second end of the cooler is communicated with the evaporator 11. The cooler contacts with or gets close to a power electronic device to carry away heat of the power electronic device to cool the power electronic device through a low-temperature coolant circulated in the cooler.

When the air conditioning unit is stopped, the coolant pump 31 is started to provide power for coolant circulation. The coolant pump 31 pumps the liquid coolant in the first condenser 13 to the bypass throttling element 32, and the coolant finally flows into the evaporator 11 to finish a cooling cycle after throttling and heat absorption evaporation. By the solution, the power electronic device is cooled when the air conditioning unit is stopped.

In order to cool the power electronic device when the air conditioning unit is started, a coolant circulation pipeline connected in parallel with the coolant pump 31 is also arranged between the first condenser 13 and the bypass throttling element 32. Preferably, a one-way valve 34 is arranged on the coolant circulation pipeline, and an inlet end of the one-way valve 34 is communicated with the first condenser 13, while an outlet end is communicated with the first end of the bypass throttling element 32. The one-way valve 34 may effectively prevent bypass short-circuit of the coolant and ensure that the power electronic device has sufficient coolant flow.

When the air conditioning unit is started to operate, since condensing side pressure is far higher than evaporation side pressure, the liquid coolant in the first condenser 13 is throttled by the bypass throttling element 32 under the action of pressure of the coolant in the air conditioning unit, absorbs heat to be evaporated at the cooler, and finally flows into the evaporator 11 to finish a cooling cycle.

After the coolant flows through the power electronic device, a large amount of heat may be absorbed, and may finally be accumulated in the coolant of the air conditioning unit to cause continuous increase of system temperature and system pressure of the air conditioning unit in a shutdown state if not being released. If the cooling system works for long in the shutdown state of the air conditioning unit, the system temperature is continuously increased, which may cause influence on a cooling effect of the power electronic device, and the system pressure is continuously increased, which may cause influence on safety of the whole cooling circulation system. Preferably, a second condenser 33 is arranged between the cooler and the evaporator 11, the low-temperature coolant flowing out of the bypass throttling element 32 absorbs heat dissipated by the power electronic device to be evaporated into coolant vapor at higher temperature at the cooler, and the coolant vapor exchanges heat with air or water to release heat to be condensed into a liquid coolant again when flowing to the second condenser, and the liquid coolant enters the evaporator 11, and returns to the air conditioning unit to finish a cooling cycle.

A function of the second condenser 33 is to improve reliability of the system and enable the cooling system to normally work for a long time in the shutdown state of the air conditioning unit. In addition, when the air conditioning unit is started to work, the second condenser 33 may also prevent a great amount of heat from entering the evaporator 11 to reduce energy efficiency of the air conditioning unit. The second condenser 33 usually adopts a finned tube heat exchanger or a plate heat exchanger.

Wherein, the cooler is a metal cooling plate into which a coolant flow passage is embedded, the metal cooling plate contacts with the power electronic device, a proper cooler type may also be selected according to a factor such as a field environment condition and a shape and cooling requirement of the power electronic device, and for example, for a device incapable of contact heat exchange or with a low cooling requirement, a finned tube heat exchanger, a plate-fin heat exchanger or the like may be adopted as the cooler.

If cooling may not be implemented by one cooler in case of more power electronic devices to be cooled or due to structure limits, multiple coolers are connected in series on a pipeline between the bypass throttling element 32 and the second condenser 33 or multiple parallel cooling branches are arranged between the coolant pump 31 and the second condenser 33, and a bypass throttling element 32 and at least one cooler are arranged on each cooling branch. The bypass throttling elements 32 may adopt throttling valves in different forms, such as capillary tubes, throttling orifice plates (fixed or variable), thermal expansion valves or electronic expansion valves, and combinations of two or more than two of the throttling valves.

Figure 2:
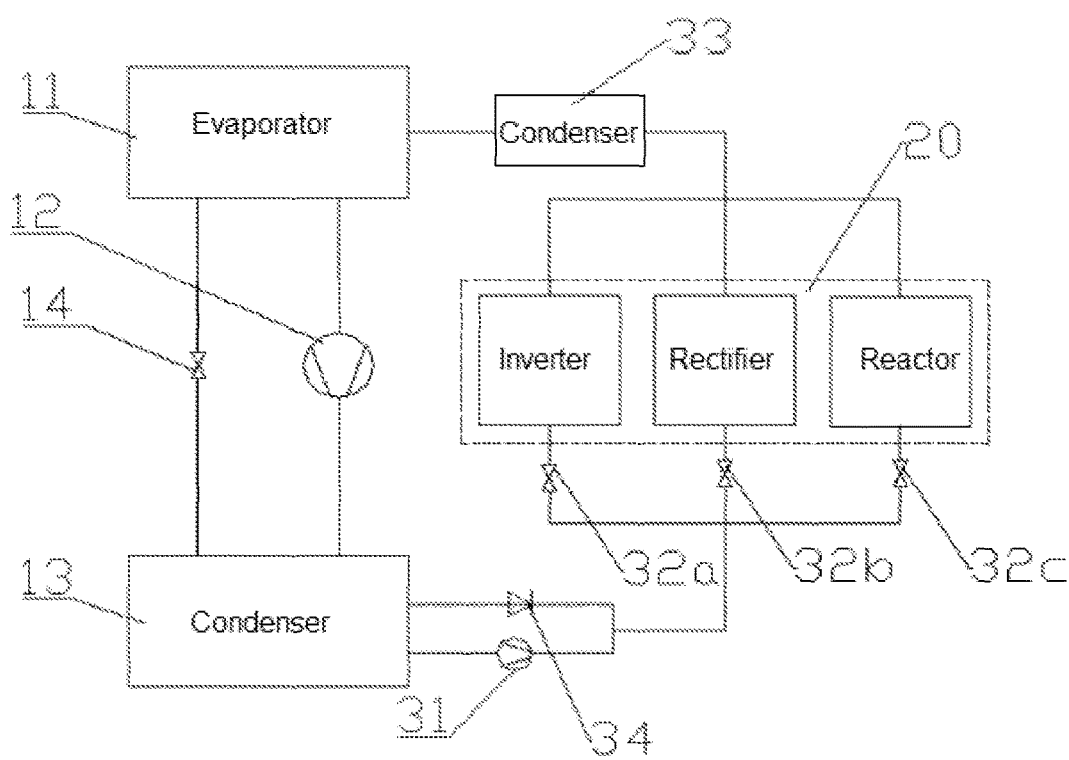
FIG. 2 is a structure diagram of a power electronic device cooling system with multiple cooling branches according to embodiment 1 of the invention.

FIG. 2 is a structure diagram of a power electronic device cooling system adopting multi-branch cooling. The coolant discharged by the coolant pump 31 and/or the one-way valve 34 enters three cooling branches after being divided by a flow division device, a bypass throttling element 32 and at least one cooler being arranged on each branch. Specifically, the power electronic device is a converter, and includes a rectifier module, an inverter module and a reactor. The rectifier module and the inverter module have higher cooling requirements, a first bypass throttling element 32a and a second bypass throttling element 32b arranged on two branches are adjustable throttling elements, such as electronic expansion valves, and openings of the electronic expansion valves are regulated according to actual temperature of the rectifier module and the inverter module to obtain a proper coolant flow. A third bypass throttling element 32c located on the other branch may adopt a fixed throttling element, such as a fixed orifice plate or a capillary tube, and optimal throttling elements are matched according to system performance. Wherein, the coolers configured to cool the rectifier module and the inverter module are metal cooling plate structures with coolant circulation pipelines, the rectifier module and the inverter module contact with the metal cooling plates, and compared with an air cooling manner, such a cooling manner has a better cooling effect, is high in cooling speed and cooling efficiency and may greatly reduce a size of the converter and lower a type selection requirement of the elements.

The air conditioning unit is preferably a central air conditioning unit, the central air conditioning unit having high coolant storage capacity sufficient to meet a cooling requirement, is further a water-cooled air conditioning unit, and furthermore, is a centrifugal water-cooled unit or a screw water-cooled unit.

The power electronic device in the embodiment may be a power electronic device which keeps normal operation of the air conditioning unit, and may also be a power electronic device in other equipment.

From the above, the cooling system provided by the invention well solves a cooling problem of the power electronic device, and a cooling capability of the coolant is higher than those of air cooling and water cooling; the solution is free of influence of starting and stopping of the air conditioning unit, and when the air conditioning unit is stopped, the cooling requirement may also be met; a coolant flow of each branch may also be regulated according to the cooling requirement; the coolant is an insulator, and is free of short circuit or a hidden electric leakage danger and high in safety; and the coolant of the air conditioning unit is utilized to finish the cooling cycles, so that the power electronic device may be located in a sealed environment and prevented from influence of dust, and is internally clean and long in operation life.

Embodiment 2

Figure 3:
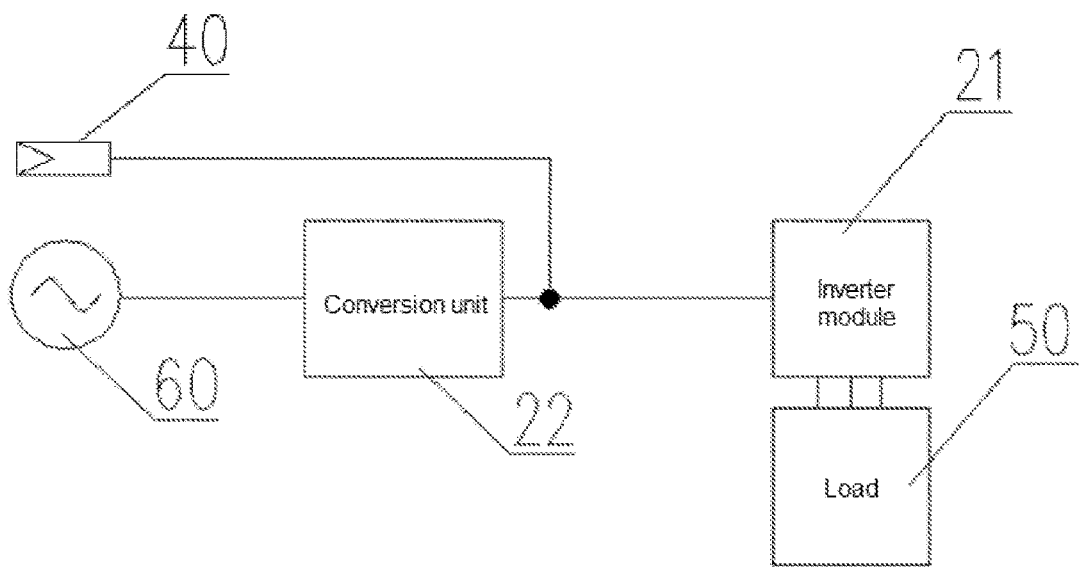
FIG. 3 is a structure diagram of a distributed power generation system according to embodiment 2 of the invention.

The invention also provides a distributed power generation system. As shown in FIG. 3, the distributed power generation system includes the abovementioned power electronic device cooling system (not shown in the figure) and a distributed power plant 40, wherein the distributed power plant 40 supplies power to a load 50 and/or is connected to a public grid 60 for power generation through a power electronic device. The load 50 includes the abovementioned air conditioning unit, and may also include other electric equipment. The power electronic device includes an off-grid inverter 21, a converter 22 and the like. The off-grid inverter 21 is connected between the distributed power plant 50 and the air conditioning unit or another load, and the distributed power plant 40 supplies power to the air conditioning unit or the other load through the off-grid inverter 21. One end of the converter 22 is connected with the public grid 60, while the other end is connected with the distributed power plant 40 and/or the off-grid inverter 21, the distributed power plant 40 is connected to the public grid 60 for power generation through the converter 22, and the air conditioning unit or the other load may gain electricity from the public grid through the converter 22.

Specifically, the distributed power plant may be a photovoltaic power plant, a wind power plant, a wind-solar power plant, a biomass power plant and the like, and is preferably a photovoltaic power plant.

The distributed power generation system provided by the invention has a power electronic device cooling unit, so that reliability of the distributed power generation system may be improved, service life of the distributed power generation system may be prolonged, and a type selection requirement of the power electronic device may be lowered.

The abovementioned embodiments only represent some implementation modes of the invention, are specifically described in detail, but may not thus be understood as limits to the scope of the invention. It should be pointed out that those skilled in the art may also make various transformations and improvements without departing from the concept of the invention, and these transformations and improvements all fall within the scope of protection of the invention. Therefore, the scope of protection of the invention should be subject to the appended claims.

The invention claimed is:

1. A power electronic device cooling system, comprising:
an air conditioning unit, a coolant pump, bypass throttling elements and coolers,
wherein the air conditioning unit comprises an evaporator, a compressor, a first condenser and a main branch throttling element which are connected into an air conditioning cooling circulation system,
the first condenser, the coolant pump, the bypass throttling elements, the coolers and the evaporator are sequentially communicated,
an inlet of the coolant pump is communicated with the first condenser, an outlet of the coolant pump is communicated with a first end of the bypass throttling elements, a second end of the bypass throttling elements is communicated with a first end of the coolers, a second end of the coolers is communicated with the evaporator, and the coolers exchanges heat with a power electronic device to cool the power electronic device,
a second condenser, wherein the second condenser is connected between the coolers and the evaporator,
multiple cooling branches, wherein each cooling branch comprises one of the bypass throttling elements and at least one of the coolers, an inlet of each cooling branch is communicated with the outlet of the coolant pump and the outlet of a one-way valve, and an outlet of each cooling branch is communicated with the second condenser,
a coolant circulation pipeline, which is arranged between the first condenser and the bypass throttling elements, and is arranged in parallel with a pipeline having the coolant pump, the one-way valve is provided in the coolant circulation pipeline, according to operation states of the air conditioning unit, the coolant circulation pipeline or the pipeline having the coolant pump is put into use, wherein:
when the air conditioning unit is stopped, the refrigerant in the first condenser flows to the multiple cooling branches through the pipeline having the coolant pump, and the refrigerant passes through the bypass throttling elements and the coolers to cool down the power electronic device, then the refrigerant flows to the evaporator through the second condenser, or
when the air conditioning unit is started to operate, the refrigerant in the first condenser flows to the multiple cooling branches through the coolant circulation pipeline and one-way valve, and the refrigerant passes through the bypass throttling elements and the coolers to cool down the power electronic device, then the refrigerant flows to the evaporator through the second condenser.

2. The power electronic device cooling system according to claim 1, further comprising the one-way valve, wherein an inlet of the one-way valve is communicated with the first condenser, and an outlet is communicated with the first end of each bypass throttling element.

3. The power electronic device cooling system according to claim 1, wherein each bypass throttling element is one or a combination of two or more of a capillary tube, a throttling orifice plate, a thermal expansion valve and an electronic expansion valve.

4. The power electronic device cooling system according to claim 1, wherein the air conditioning unit is a water-cooled air conditioning unit.

5. The power electronic device cooling system according to claim 1, wherein the power electronic device comprises a rectifier module and an inverter module, the cooling branches comprise a first cooling branch and a second cooling branch, the first cooling branch is configured to cool the rectifier module, and the second cooling branch is configured to cool the inverter module.

6. The power electronic device cooling system according to claim 5, wherein the power electronic device further comprises a reactor, and the cooling branches further comprise a third cooling branch configured to cool the reactor.

7. The power electronic device cooling system according to claim 6, wherein the first cooling branch comprises a first bypass throttling element, the second cooling branch comprises a second bypass throttling element, the third cooling branch comprises a third bypass throttling element, the first bypass throttling element and the second bypass throttling element are adjustable throttling elements, and the third bypass throttling element is a fixed-proportion throttling element.

8. A distributed power generation system, comprising a power electronic device cooling system and a distributed power plant, wherein the power electronic device cooling system is the power electronic device cooling system according to claim 1, the distributed power generation system supplies power to a load and/or performs grid-connected power generation through a power electronic device, and the load comprises an air conditioning unit.

9. The distributed power generation system according to claim 8, wherein the power electronic device comprises an off-grid inverter, and the distributed power plant is connected with the off-grid inverter, and supplies power to the air conditioning unit through the off-grid inverter.

10. The distributed power generation system according to claim 9, wherein the power electronic device further comprises a converter, and one end of the converter is connected with a public grid, while the other end is connected with the distributed power plant and/or the off-grid inverter.

* * * * *